United States Patent [19]

Miura

[11] Patent Number: 5,519,661

[45] Date of Patent: May 21, 1996

[54] SEMICONDUCTOR MEMORY CIRCUIT WITH BIT LINE DETECTOR CONTROLLING ACCESS TO DATA BUS LINES

[75] Inventor: Naoki Miura, Tokyo, Japan

[73] Assignee: Oki Electric Industry Co., Ltd., Tokyo, Japan

[21] Appl. No.: 281,835

[22] Filed: Jul. 28, 1994

[30] Foreign Application Priority Data

Aug. 10, 1993 [JP] Japan .................................. 5-198402

[51] Int. Cl.$^6$ ...................................... G11C 7/06
[52] U.S. Cl. .......................... 365/205; 365/190; 365/208; 365/210; 365/230.06
[58] Field of Search ..................... 365/205, 190, 365/208, 210, 230.06

[56] References Cited

U.S. PATENT DOCUMENTS

| | | | |
|---|---|---|---|
| 4,803,663 | 2/1989 | Miyamoto et al. | 365/205 |
| 4,807,195 | 2/1989 | Busch et al. | 365/205 |
| 4,926,382 | 5/1990 | Sakui et al. | 365/210 |
| 4,952,826 | 8/1990 | Hoshi | 365/205 |
| 5,132,930 | 7/1992 | Furutani et al. | 365/190 |
| 5,274,598 | 12/1993 | Fujii et al. | 365/205 |

FOREIGN PATENT DOCUMENTS 3-207088  9/1991  Japan .

Primary Examiner—Joseph E. Clawson, Jr.
Attorney, Agent, or Firm—Frishauf, Holtz, Goodman, Langer & Chick

[57] ABSTRACT

A semiconductor memory circuit comprises bit line pairs each of which has a pair of bit lines which are coupled to memory cells and have a first end portion and a second end portion, a pair of data bus lines, sense amplifiers each of which is coupled to a corresponding bit line pair, switching circuits each of which is coupled between the first end portion of the corresponding bit line pair and the data bus lines, each of the switching circuits connecting the bit line of the corresponding bit line pair and one of the data bus lines in response to a control signal, voltage difference detecting circuits each of which is coupled to the second end portion of the corresponding bit line pair, each of the voltage difference detecting circuits generating a detection signal when the bit lines of the corresponding bit line pair have different voltage potentials from each other, and a decoding circuit generating the control signals in response to address signals and the detection signal so that the corresponding bit line pair and the data bus lines are coupled together after the bit lines of the corresponding bit line pair have different voltage potentials from each other.

11 Claims, 4 Drawing Sheets

5,519,661

SEMICONDUCTOR MEMORY CIRCUIT WITH BIT LINE DETECTOR CONTROLLING ACCESS TO DATA BUS LINES

CROSS-REFERENCE TO RELATED APPLICATIONS

This application claims priority benefits under 35 USC §119 of Japanese Application Serial No. 198402/1993, filed Aug. 10, 1993, the entire disclosure of which is incorporated herein by reference.

BACKGROUND OF THE INVENTION

This invention relates to a semiconductor memory circuit, and particularly to a semiconductor memory circuit which features a method of controlling a data bus employed in a dynamic random access memory (hereinafter "DRAM").

As this type of circuit, there has heretofore been known one disclosed in Japanese Laid-Open Patent Application No. 207088/1991.

FIG. 4 is a block diagram schematically showing the structure of a read unit employed in the DRAM. The configuration shown in FIG. 4 is a general DRAM's memory cell block diagram. The present invention has also such configuration.

In FIG. 4, external address signals supplied from the outside are converted into internal address signals by an address buffer AB. Next, the converted internal address signals are input to an X decoder ADX and a Y decoder ADY respectively. The contents stored at a predetermined address in a memory cell array MA, which has been selected by the X decoder ADX and the Y decoder ADY, are output to an output buffer OB through a sense amplifier (SA) and an input/output interface circuit (I/O) SI. Thereafter, the contents are read out as output data Dout from the output buffer OB. The entire operation of the read unit is controlled based on various control signals VB, Rn, øE, øP and øS output from a control signal generating circuit CG.

However, in the aforementioned conventional semiconductor memory circuit, if excessive allowance for the timing for electrically connecting the bit line pair to the data buses is made, then a quick access cannot be obtained. Further, when the data buses are electrically connected to the bit line pair before a sufficient sense operation is performed, information stored in each of the cells arranged within a memory cell array is destroyed due to variations in process and the like.

SUMMARY OF THE INVENTION

It is an object of the present invention to provide a semiconductor memory circuit capable of detecting whether a bit line pair is in a sufficiently activated state, activating a Y decoder based on the result of detection so as to obtain a quick access and preventing information stored in the cells from being destroyed.

The foregoing objects are accomplished with a semiconductor memory circuit comprising bit line pairs each of which has a pair of bit lines which are coupled to memory cells and have a first end portion and a second end portion, a pair of data bus lines, sense amplifiers each of which is coupled to a corresponding bit line pair, switching circuits each of which is coupled between the first end portion of the corresponding bit line pair and the data bus lines, each of the switching circuits connecting the bit line of the corresponding bit line pair and one of the data bus lines in response to a control signal, voltage difference detecting circuits each of which is coupled to the second end portion of the corresponding bit line pair, each of the voltage difference detecting circuits generating a detection signal when the bit lines of the corresponding bit line pair have different voltage potentials from each other, and a decoding circuit generating the control signals in response to address signals and the detection signal so that the corresponding bit line pair and the data bus lines are coupled together after the bit lines of the corresponding bit line pair have different voltage potentials from each other.

DETAILED DESCRIPTION OF THE PREFERRED EMBODIMENT

Figure 1:
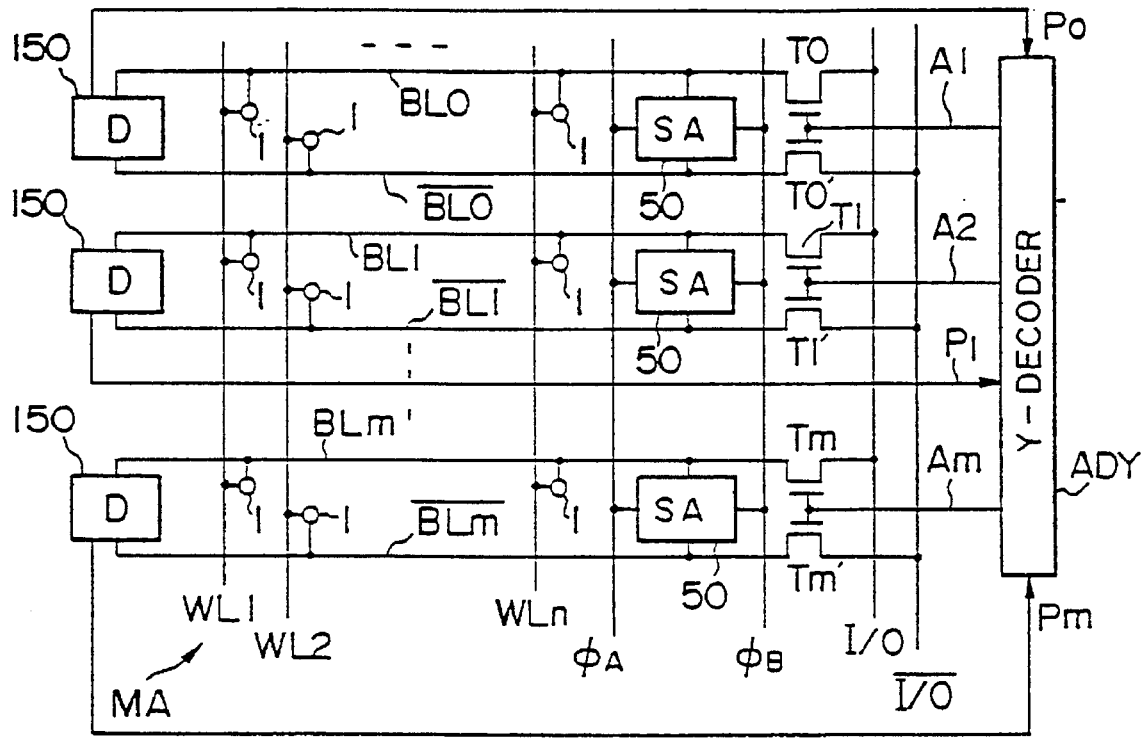
FIG. 1 is a view schematically showing the configuration of a memory cell array according to the embodiment of the present invention.
Figure 2:
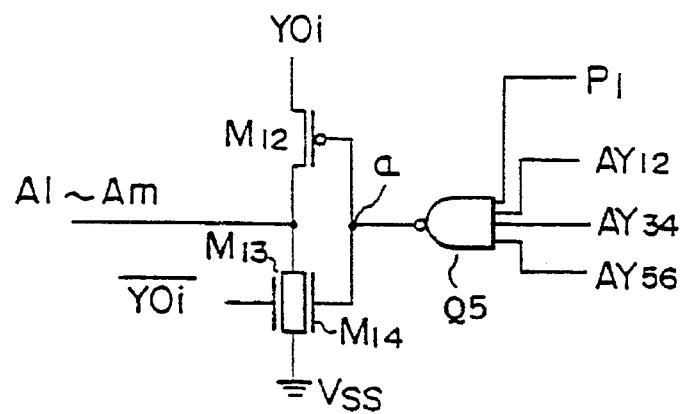
FIG. 2 is a view illustrating one example of a decode circuit for a Y decoder.
Figure 3:
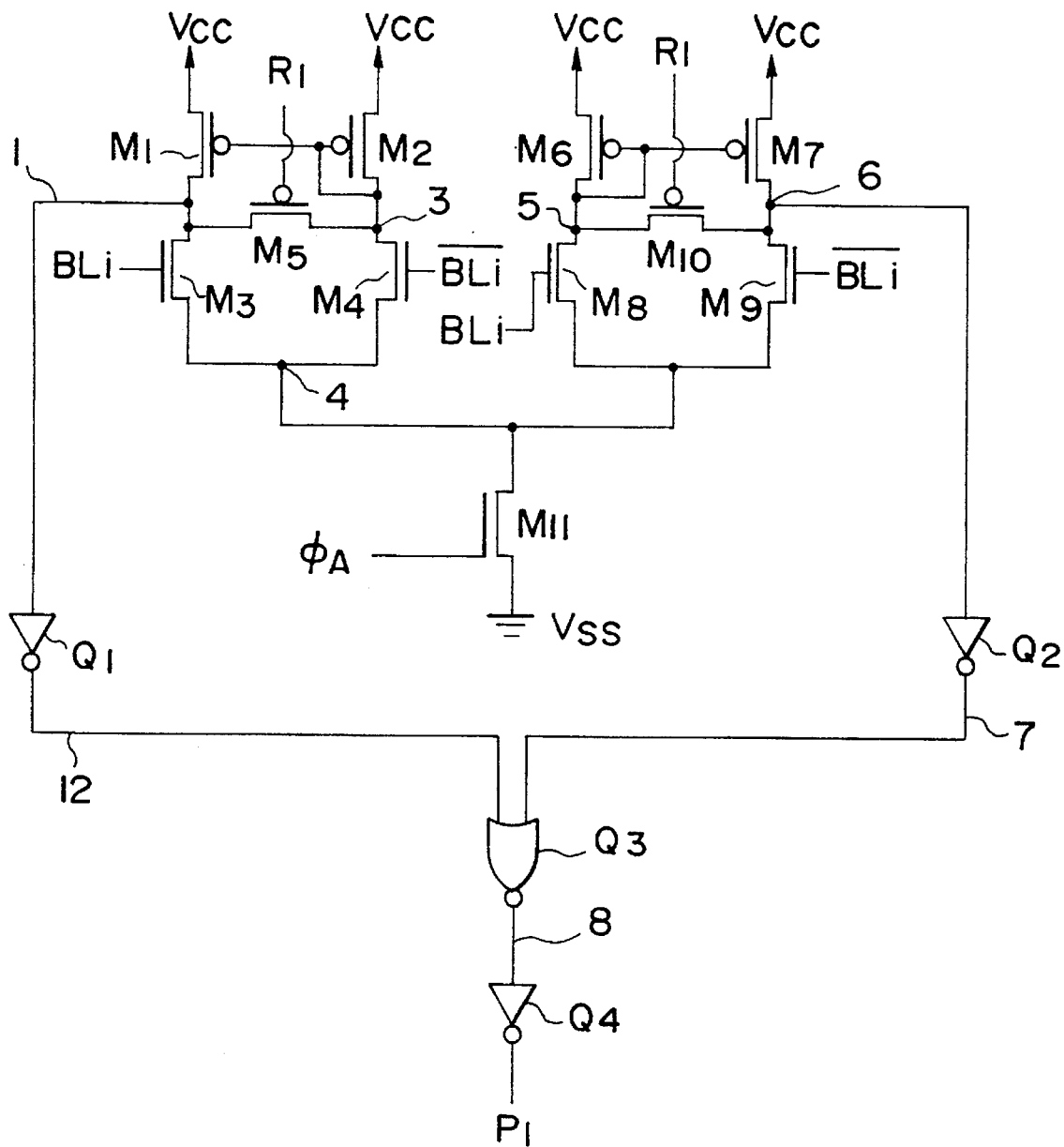
FIG. 3 is a circuit diagram showing a voltage difference detecting circuit shown in FIG. 1.
Figure 4:
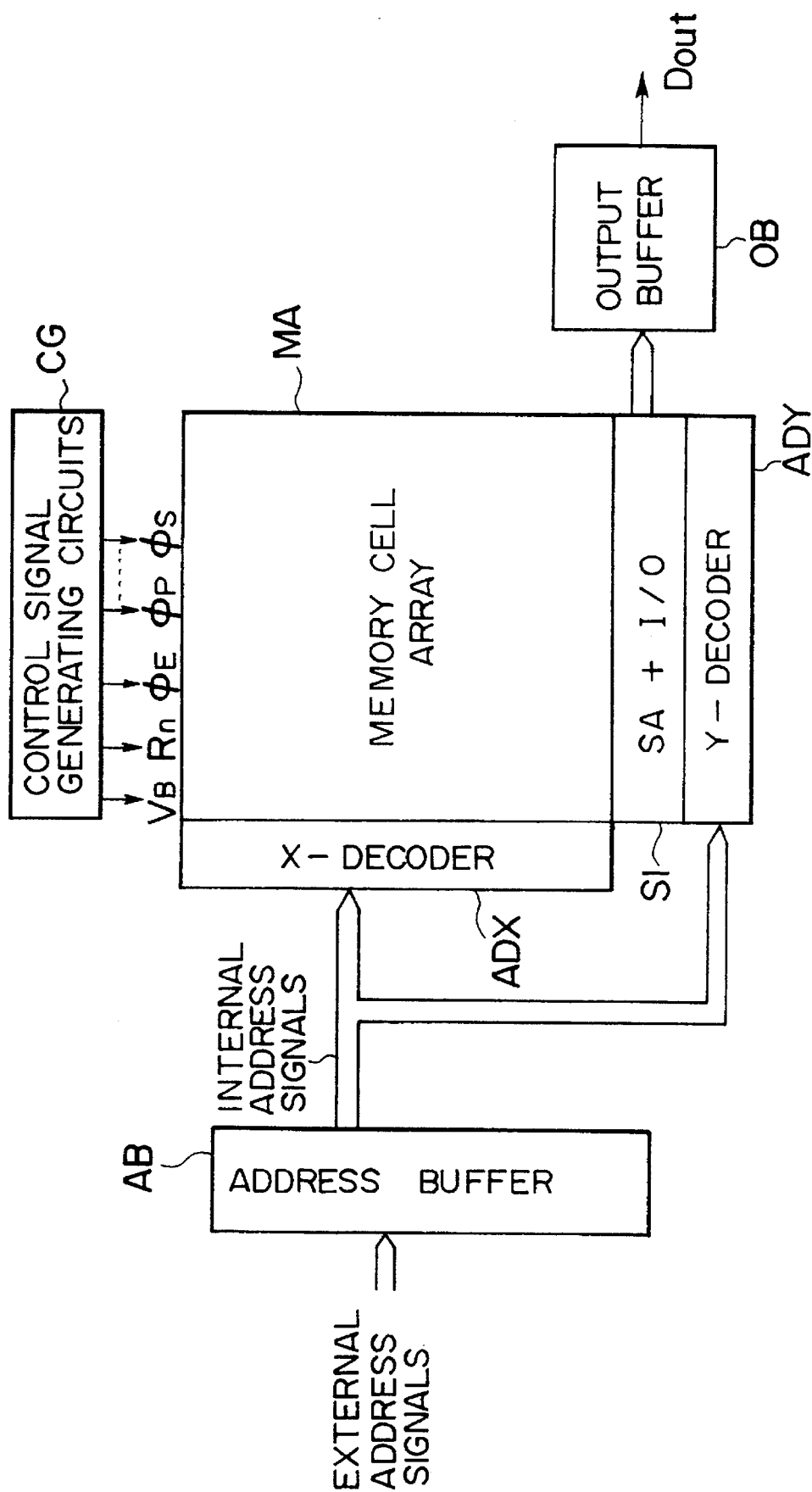
FIG. 4 is a block diagram schematically depicting the configuration of a read unit of a DRAM.

FIG. 1 is a circuit diagram showing a semiconductor memory circuit according to one embodiment of the present invention. Described specifically, FIG. 1 schematically shows the configuration of a memory cell array and its associated circuit. FIG. 2 illustrates one example of a decode circuit for a Y decoder. FIG. 3 depicts one example of a voltage difference detecting circuit which detects a difference in potential between a pair of bit lines.

As shown in FIG. 1, a plurality of memory cells 1 are connected to a corresponding word line WL1 to WLn and a corresponding pair of bit lines BL1 to BLm and bar BL1 to bar BLm. A plurality of voltage difference detecting circuits 150 are provided together with a plurality of sense amplifiers 50 each electrically connected between the pair of bit lines. The voltage difference detecting circuit 150 is formed at the left ends of the pair of bit lines and generates a detection signal P0 to Pm when the pair of bit lines have different voltage potentials. On the other hand, the sense amplifier 50 is formed at the right ends of the pair of bit lines and activated so as to start a reading operation in response to activation signals øA and øB.

Transfer transistors T0 to Tm and T0' to Tm' are connected between the right ends of the pair of bit lines and a pair of data bus lines I/O and bar I/O. Transfer transistors T0 to Tm and T0' to Tm' are controlled by decode signals A1 to Am which are generated in the Y decoder ADY. The signal P0 generated by voltage difference detecting circuits 150 is sent to the Y decoder ADY so that the Y decoder ADY starts a selection operation in response to the detected signal P1.

Referring to FIG. 2, the gate and drain of a P type MOSFET M12 are respectively electrically connected to a node (a) and column lines A1 through Am. A signal YOi is supplied to the source of the MOSFET M12. The source and drain of an N type MOSFET M13 are respectively electrically connected to the column lines A1 through Am and the ground Vss. A signal bar YOi is supplied to the gate of the MOSFET M13. Further, the source, gate and drain of a MOSFET M14 are respectively electrically connected to the column lines A1 through Am, the node (a) and the ground Vss. A NAND gate Q5 outputs a node signal (a) in response to address signals AY12, AY34, AY56 and the detected signal P1 input to the NAND gate Q5.

Referring to FIG. 3, the voltage difference detecting circuit includes first and second current mirror circuits and an output circuit. In the first current mirror circuit, the source and drain of a P type MOSFET M1 are respectively electrically connected to a power supply Vcc and a node (1). The source and drain of a P type MOSFET M2 are respectively electrically connected to the power supply Vcc and a node (3). The gates of the MOSFETs M1 and M2 are electrically connected to the drain of the MOSFET M2 together. The source, drain and gate of an N type MOSFET M3 are respectively electrically connected to a node (4), the node (1) and a bit line BLi. The source, drain and gate of an N type MOSFET M4 are respectively electrically connected to the node (4), the node (3) and a bit line bar BLi. The source and drain of a P type MOSFET M5 are respectively electrically connected to the nodes (1) and (3). A signal R1 is supplied to the gate of the MOSFET M5.

In the second current mirror circuit, the source and drain of a P type MOSFET M6 are respectively electrically connected to the power supply Vcc and a node (5). The source and drain of a P type MOSFET M7 are respectively electrically connected to the power supply Vcc and a node (6). The gates of the MOSFETs M6 and M7 are electrically connected to the drain of the MOSFET M6 together. The source, drain and gate of an N type MOSFET M8 are respectively electrically connected to the node (4), the node (5) and the bit line BLi. The source, drain and gate of an N type MOSFET M9 are respectively electrically connected to the node (4), the node (6) and the bit line bar BLi. The source and drain of a P type MOSFET M10 are respectively electrically connected to the nodes (5) and (6). A signal R1 is supplied to the gate of the MOSFET M10.

The source and drain of an N type MOSFET M11 are respectively electrically connected to the ground Vss and the node (4). A signal ØA which is the activation signal of the sense amplifier is supplied to the gate of the MOSFET M11.

The output circuit includes three inverters Q1, Q2 and Q4 and a NOR gate Q3. The inverter Q1 receives a signal from the node (1) (the output of the first current mirror circuit) and inverts the same. Thereafter, the inverter Q1 outputs the inverted signal to the line (12). The inverter Q2 receives a signal from the node (6) (the output of the second current mirror circuit) and inverts the same. Thereafter, the inverter Q2 outputs the inverted signal to the line (7). The NOR gate Q3 receives outputs from the lines (12) and (7) (the outputs of the inverters Q1 and Q2) and outputs a NOR signal to a line (8). Further, the inverter Q4 inverts an input supplied from the line (8) (the output of the NOR gate Q3) and outputs the inverted signal therefrom as a detected signal P1.

Figure 5:
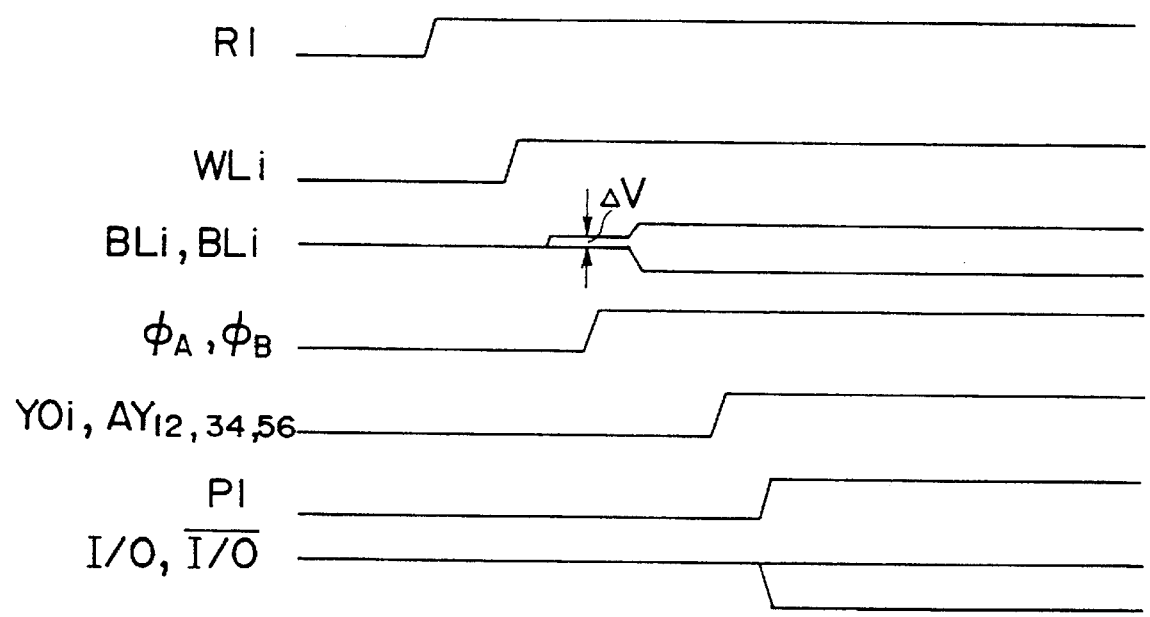
FIG. 5 is a timing chart for describing the operation of the embodiment shown in FIG. 1.

FIG. 5 is a timing chart for describing the operation of the embodiment shown in FIG. 1. The operation of the semiconductor memory will be described with reference to FIGS. 1 and 5. Upon resetting the semiconductor memory circuit, a signal R1 is set to a low level "L" and the voltage difference detecting circuit 150 is reset. Thereafter, the signal R1 is raised and a word line WLi is set to "H" level. As a result, a potential difference ΔV is developed between the bit line pair BLi and bar BLi. The activation signals ØA and ØB are set to "H" levels with a given delay after the word line WLi is set to "H" level. The potential difference ΔV is amplified by the sense amplifier 50 which is activated by the "H" level of the activation signals ØA and ØB. Then, the voltage potentials of the bit line pair BLi and bar BLi are become to the power supply potential level Vcc and the ground potential level Vss.

When the voltage difference detecting circuit 150 is operated in response to the activation signal ØA and a potential difference between the bit line pair BLi and bar BLi is detected by the voltage difference detecting circuit 150, the detected signal P1 is changed from "L" level to the "H" level. Before the change of the detected signal P1, the activation signal of the Y decoder YOi and the address signals AY12, AY34 and AY56 are changed from "L" level to the "H" level. Therefore, a signal on the line a (see FIG. 2) is changed from the "H" level to the "L" level in response to the detected signal P1. As a result, the bit line pair is electrically connected to data buses.

According to the present invention as has been described in detail based on the above embodiment, the circuit for sensing the difference in potential between the bit line pair is provided so as to monitor the difference in potential therebetween. When the potential difference reaches a predetermined potential level, the voltage difference detecting circuit outputs the detected signal therefrom. As a result, the Y decoder starts the selection operation so as to electrically connect the bit line pair to the data buses. It is therefore possible to read data with the optimum timing without destroying information in each cell.

Having now fully described the invention, it will be apparent to those skilled in the art that many changes and modifications can be made without departing from the spirit or scope of the invention as set forth herein.

What is claimed is:

1. A semiconductor memory circuit comprising:

a plurality of bit line pairs, each of which has a pair of bit lines, each of the bit lines being coupled to a plurality of memory cells;

a pair of data bus lines;

a plurality of sense amplifiers, each of which is coupled to a corresponding bit line pair;

a plurality of switching circuits, each of which is coupled between the corresponding bit line pair and the data bus lines, each of said switching circuits connecting the corresponding bit line pair and the data bus lines in response to a control signal;

a plurality of voltage difference detecting circuits, each of which is coupled to the corresponding bit line pair, each of said voltage difference detecting circuits generating a detection signal when the bit lines of the corresponding bit line pair have different voltage potentials from each other; and a decoding circuit generating the control signal in response to a plurality of address signals and the detection signal so that the corresponding bit line pair and said data bus lines are coupled together after the bit lines of the corresponding bit line pair have different voltage potentials from each other.

2. A semiconductor memory circuit according to claim 1, wherein each of said voltage difference detecting circuits includes:

first and second current mirror circuits, each of which is coupled to the corresponding bit line pair, the first current mirror circuit generating a first difference signal when one bit line of the corresponding bit line pair has a higher voltage potential than that of the other bit line of the corresponding bit line pair, the second current mirror circuit generating a second difference signal when the other bit line of the corresponding bit line pair has higher voltage potential than that of the one bit line of the corresponding bit line pair; and an output circuit coupled to the first and second current mirror circuits, the output circuit generating the detection signal in response to the first or second difference signals.

3. A semiconductor memory circuit according to claim 2, wherein the first current mirror circuit includes:

an output line for outputting the first difference signal;

a first transistor having a first electrode coupled to a first voltage potential, a second electrode coupled to the output line and a control electrode;

a second transistor having a first electrode coupled to the first voltage potential, a second electrode and a control electrode coupled to the second electrode thereof and the control electrode of the first transistor;

a third transistor having a first electrode coupled to a second voltage potential, a second electrode coupled to the output node and a control electrode coupled to the one bit line of the corresponding bit line pair; and a fourth transistor having a first electrode coupled to the second voltage potential, a second electrode coupled to the second electrode of the second transistor and a control electrode coupled to the other bit line of the corresponding bit line pair.

4. A semiconductor memory circuit according to claim 2, wherein the second current mirror circuit includes:

an output node for outputting the second difference signal;

a first transistor having a first electrode coupled to a first voltage potential, a second electrode coupled to the output node and a control electrode;

a second transistor having a first electrode coupled to the first voltage potential, a second electrode and a control electrode coupled to the second electrode thereof and the control electrode of the first transistor;

a third transistor having a first electrode coupled to a second voltage potential, a second electrode coupled to the output node and a control electrode coupled to the other bit line of the corresponding bit line pair; and a fourth transistor having a first electrode coupled to the second voltage potential, a second electrode coupled to the second electrode of the second transistor and a control electrode coupled to the one bit line of the corresponding bit line pair.

5. A semiconductor memory circuit according to claim 2, wherein the output circuit includes a gate circuit having a first input terminal for receiving the first difference signal, a second input terminal for receiving the second difference signal and an output terminal for outputting the detection signal.

6. A semiconductor memory circuit comprising:

a memory cell array having a plurality of memory cells, a plurality of word lines connected to the memory cells and a plurality of pairs of bit lines connected to the memory cells;

an address buffer for receiving external address signals and outputting internal address signals;

an X-decoder for selecting one of the word lines in response to the internal address signals;

a pair of data bus lines;

a sense amplifier coupled to the pair of bit lines;

a switching circuit coupled between the pair of bit lines and the pair of data bus lines, said switching circuit connecting the pair of bit lines and the pair of data bus lines in response to a control signal;

a voltage difference detecting circuit coupled to the pair of bit lines, said voltage difference detecting circuit generating a detection signal when the bit lines of the pair of bit lines have different voltage potentials from each other; and a Y-decoder generating the control signal in response to the internal address signals and the detection signal so that the pair of bit lines and the pair of data bus lines are coupled together after the pairs of bit lines have different voltage potentials from each other.

7. A semiconductor memory circuit according to claim 6, wherein said voltage difference detecting circuit includes:

first and second current mirror circuits, each of which is coupled to said pair of bit lines, the first current mirror circuit generating a first difference signal when one bit line has a higher voltage potential than the other bit line's voltage potential, the second current mirror circuit generating a second difference signal when the other bit line has a higher voltage potential than the one bit line's voltage potential; and an output circuit coupled to the first and second current mirror circuits, the output circuit generating the detection signal in response to the first or second difference signals.

8. A semiconductor memory circuit according to claim 7, wherein the first current mirror circuit includes:

an output node for outputting the first difference signal;

a first transistor having a first electrode coupled to a first voltage potential, a second electrode coupled to the output node and a control electrode;

a second transistor having a first electrode coupled to the first voltage potential, a second electrode and a control electrode coupled to the second electrode thereof and the control electrode of the first transistor;

a third transistor having a first electrode coupled to a second voltage potential, a second electrode coupled to the output node and a control electrode coupled to the one bit line; and a fourth transistor having a first electrode coupled to the second voltage potential, a second electrode coupled to the second electrode of the second transistor and a control electrode coupled to the other bit line.

9. A semiconductor memory circuit according to claim 7, wherein the second current mirror circuit includes:

an output node for outputting the second difference signal;

a first transistor having a first electrode coupled to a first voltage potential, a second electrode coupled to the output node and a control electrode;

a second transistor having a first electrode coupled to the first voltage potential, a second electrode and a control electrode coupled to the second electrode thereof and the control electrode of the first transistor;

a third transistor having a first electrode coupled to a second voltage potential, a second electrode coupled to the output node and a control electrode coupled to the other bit line; and a fourth transistor having a first electrode coupled to the second voltage potential, a second electrode coupled to the second electrode of the second transistor and a control electrode coupled to the one bit line.

10. A semiconductor memory circuit according to claim 7, wherein the output circuit includes a gate circuit having a first input terminal for receiving the first difference signal, a second input terminal for receiving the second difference signal and an output terminal for outputting the detection signal.

11. A method of transferring data from a pair of bit lines to a pair of data bus lines, comprising the steps of:

selecting a word line from among a plurality of word lines to output data from a memory cell coupled to the selected word line to one bit line of the pair of bit lines;

activating a sense amplifier to amplify a voltage difference on the pair of bit lines which are coupled to the activated sense amplifier;

detecting the voltage difference on the pair of bit lines to output a detecting Signal; and coupling the pair of bit lines to the pair of data bus lines to transfer data in response to the detection signal and an address signal whereby the bit lines and data lines are coupled after the voltage differences that appeared on the pair of bit lines are amplified.

* * * * *

UNITED STATES PATENT AND TRADEMARK OFFICE
CERTIFICATE OF CORRECTION

PATENT NO. : 5,519,661
DATED : May 21, 1996
INVENTOR(S) : Miura

It is certified that error appears in the above-indentified patent and that said Letters Patent is hereby corrected as shown below:

Column 1, line 63, delete "!"

Column 4, line 3, delete "are"
         line 4, delete "to"
         line 5, after "Vss" insert --, respectively--

Column 5, line 4, after "has" insert --a--

Column 8, line 5 (claim 11), "Signal" should be --signal--

Signed and Sealed this

Twenty-fifth Day of February, 1997

Attest:

BRUCE LEHMAN

*Attesting Officer*    *Commissioner of Patents and Trademarks*